(12) United States Patent
Kyufu

(10) Patent No.: US 9,051,661 B2
(45) Date of Patent: Jun. 9, 2015

(54) SILICON SINGLE CRYSTAL PRODUCTION METHOD

(75) Inventor: Shinichi Kyufu, Yamagachi (JP)

(73) Assignee: Siltronic AG, Munich (DE)

( * ) Notice: Subject to any disclaimer, the term of this patent is extended or adjusted under 35 U.S.C. 154(b) by 988 days.

(21) Appl. No.: 13/189,645

(22) Filed: Jul. 25, 2011

(65) Prior Publication Data

US 2012/0031323 A1   Feb. 9, 2012

(30) Foreign Application Priority Data

Aug. 6, 2010 (JP) ................................. 2010-178014

(51) Int. Cl.
| | |
|---|---|
| C30B 15/20 | (2006.01) |
| C30B 15/22 | (2006.01) |
| C30B 29/06 | (2006.01) |
| C30B 15/28 | (2006.01) |
| C30B 15/30 | (2006.01) |
| C30B 30/04 | (2006.01) |

(52) U.S. Cl.
CPC .............. C30B 29/06 (2013.01); C30B 15/28 (2013.01); C30B 15/305 (2013.01); C30B 30/04 (2013.01)

(58) Field of Classification Search
USPC .......................... 117/13, 15, 16, 17, 217, 932
See application file for complete search history.

(56) References Cited

U.S. PATENT DOCUMENTS

| | | | | |
|---|---|---|---|---|
| 5,980,629 A | * | 11/1999 | Hansen et al. ................... | 117/13 |
| 6,153,009 A | * | 11/2000 | Uesugi et al. .................... | 117/20 |
| 2003/0154906 A1 | | 8/2003 | Weber et al. | |
| 2005/0160967 A1 | * | 7/2005 | Falster et al. .................... | 117/13 |
| 2009/0293803 A1 | | 12/2009 | Tsurumaru et al. | |

FOREIGN PATENT DOCUMENTS

| | | |
|---|---|---|
| CN | 1439746 A | 9/2009 |
| JP | 2007176761 A | 7/2007 |

* cited by examiner

*Primary Examiner* — Bob M Kunemund
(74) *Attorney, Agent, or Firm* — Brooks Kushman P.C.

(57) ABSTRACT

Silicon single crystals having suppressed deformation and dislocations and the successful omission of the tail section are produced by growing the straight-body section of the silicon single crystal under the influence of a horizontal magnetic field with a magnetic flux density at its magnetic center being ≥1000 Gauss, and ≤2000 Gauss, reducing the lifting speed of the silicon single crystal relative to the surface of the melt to 0 mm/minute, maintaining a static state until there is a decrease in the apparent weight of the silicon single crystal, then further maintaining the static state so that the entire growth front of the silicon single crystal forms a convex shape protruding in a direction opposite to the lifting direction of the silicon single crystal, and separating the silicon single crystal from the melt.

1 Claim, 4 Drawing Sheets

SILICON SINGLE CRYSTAL PRODUCTION METHOD

CROSS-REFERENCE TO RELATED APPLICATION

This application claims priority to Japanese Patent Application No. JP2010-178014 filed Aug. 6, 2010 which is herein incorporated by reference.

BACKGROUND OF THE INVENTION

1. Field of the Invention

The present invention relates to a production method for silicon single crystals. More specifically, the present invention relates to a production method for silicon single crystals based on the Czochralski method (hereinafter referred to as the "CZ method") which can prevent the occurrence of dislocations during separation from the silicon melt, thereby improving the shape of the separation surface of the produced silicon single crystal thus produced.

2. Background Art

The CZ method includes the steps of heating raw material polycrystalline silicon in a crucible to produce a silicon melt, immersing a seed crystal in the silicon melt, and pulling up a silicon single crystal by gradually rewinding a wire attached to the seed crystal.

At the beginning of crystal growth, a cone section with a gradually-increasing cone diameter, i.e. an increasing-diameter section, extending from the contact surface with the seed crystal is grown, and then growth of a straight-body section, i.e. a constant-diameter section, begins when the crystal diameter has reached a target diameter. The silicon single crystal is finally separated from the raw material melt when the length of the straight-body section reaches a predetermined length.

In a CZ conventional production method, the step of separating the silicon single crystal from the raw material melt tends to cause a sudden temperature drop at the lower end of the silicon single crystal, which is the separation surface from the silicon melt. This may result in a considerably-reduced crystallization ratio (yield) due to the occurrence of slip dislocations within the silicon single crystal after being lifted up from the melt.

To avoid such dislocations, a conventional production method further includes a step of gradually narrowing the diameter of the silicon single crystal after the growth of the straight-body section before separating the silicon single crystal from the raw material melt, so that the contact surface between the silicon single crystal and the raw material melt will be small enough to avoid the occurrence of dislocations. This narrowed section is generally called a tail section. However, the tail section is known to cause a decreased yield ratio since its crystal diameter is smaller than a desired value, and therefore this section is not considered to be a product.

Accordingly, it would be desirable to reduce or omit entirely the step of producing the tail section, in order to increase productivity of silicon single crystals.

A number of techniques for reducing or omitting generation of the tail section already exist. One technique includes steps of lifting up a crucible containing the raw material melt at the same lifting speed as that of the silicon single crystal after the growth of the straight-body section, rendering the bottom surface of the silicon single crystal downward protruding, and thus suppressing dislocations during separation of the silicon single crystal from the raw material melt. (See Japanese Patent Application Publication No. 2007-176761).

In recent years, silicon wafer diameters have become increasingly lager, and 300 mm wafers are now the main products. The production of a silicon single crystals with large-diameters generally involves a strengthened natural convection current within the crucible due to the increased weight of the silicon melt, which tends to cause dislocations and a deformation of the silicon single crystal. Therefore, various approaches have been made to control the natural convection current, for example by applying a horizontal magnetic field to the silicon melt, for the purpose of suppressing dislocations and deformation.

However, application of a horizontal magnetic field adversely causes a decreased temperature difference between the center and the periphery of the phase boundary of the silicon single crystal, compared to its absence, which can prevent the silicon single crystal from forming a downward convex shape at the phase boundary, which disrupts the omission of the tail section intended to suppress the occurrence of dislocations during separation of the silicon single crystal from the melt, while suppressing dislocations and deformation in the straight-body section.

SUMMARY OF THE INVENTION

In order to solve the above-mentioned problems, after intensive studies, a process was discovered which allows for the transformation of the entire growth front of the silicon single crystal in contact with the melt into a convex shape protruding in a direction opposite to the pulling direction of the silicon single crystal, even under the influence of the horizontal magnetic field. It has been surprisingly and unexpectedly discovered that separating the silicon single crystal from the melt after transformation into the convex shape allows for the suppression of dislocations, and hence a successful omission of the tail section.

After intensive studies in pursuit of a crystal growth method for separating of the silicon single crystal from the melt at a high success rate as well as suppressing and preventing dislocations, a method was discovered which suppresses dislocations and allows for the successful omission of the tail section, by growing the straight-body section of the silicon single crystal under the influence of a horizontal magnetic field with a magnetic flux density at its magnetic center being greater than or equal to 1000 Gauss, and less than or equal to 2000 Gauss; reducing the lifting speed of the silicon single crystal relative to the surface of the melt to 0 mm/minute and maintaining a static state until there is a decrease in the apparent weight of the silicon single crystal; further maintaining the static state so that the entire growth front of the silicon single crystal contacting the melt will form a convex shape protruding in the direction opposite to the pulling direction of the silicon single crystal; and finally separating the silicon single crystal from the melt.

DETAILED DESCRIPTION OF THE PREFERRED EMBODIMENTS

The present invention allows for an appropriate control of the natural convection current in the melt and consequently the suppression of deformation and dislocations in the straight-body section, by pulling the growing silicon single crystal under the influence of a horizontal magnetic field with a magnetic flux density at its magnetic center of greater than or equal to 1000 Gauss, and less than or equal to 2000 Gauss.

The present invention also allows for the suppression of dislocations and consequently the successful omission of the tail section, by suspending the movement of the silicon single crystal relative to the surface of the silicon melt until there is a decrease in its apparent weight, and maintaining the static state so that the entire growth face of the silicon single crystal forms a convex shape protruding in a direction opposite to the pulling direction of the silicon single crystal.

Figure 1:
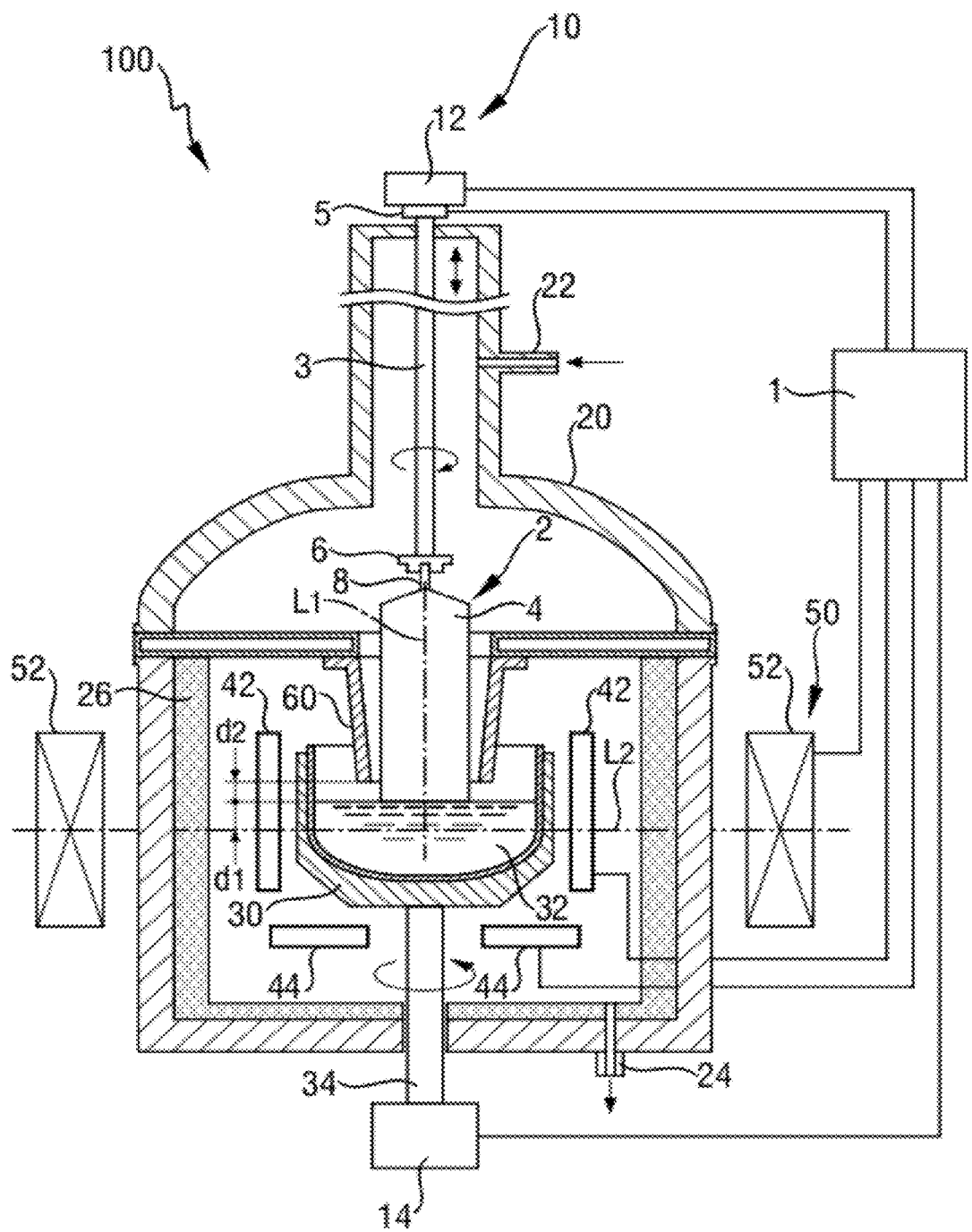
FIG. 1 is a schematic view of a silicon single crystal production equipment according to an embodiment of the present invention.

An embodiment of the present invention will be described below with reference to the attached drawings. Referring to FIG. 1, the silicon single crystal production apparatus 100 according to the present embodiment produces a silicon single crystal 2 based on the CZ method. The silicon single crystal production apparatus 100 includes a crucible 30 for containing melt 32, a driving unit 10 for not only lifting, lowering and rotating the silicon single crystal 2, but also rotating the crucible 30, and a magnetic field generating unit 50 for generating the magnetic field applied to the melt 32.

The silicon single crystal production apparatus 100 also includes a controller 1 for controlling not only the lifting movement, the rotation of the silicon single crystal 2 and the rotation of the crucible 30, both driven by the driving unit 10, but also the horizontal magnetic field generated by the magnetic field generating unit 50.

The silicon single crystal production apparatus 100 also includes a chamber 20 for containing the crucible 30 and the silicon single crystal 2, heaters 42 placed along the side wall of the crucible 30, heaters 44 placed under the crucible 30, and a heat insulator 26 attached to the side wall and the inner bottom of the chamber 20.

The silicon single crystal production apparatus 100 includes a wire 3 hung from the top of the chamber 20, a weight measuring unit 5 for measuring the apparent weight of the silicon single crystal 2, and a chuck 6 attached to the tip of the wire 3 for holding seed crystal 8. The weight measuring unit 5 is typically a load cell. The apparent weight is calculated by subtracting the buoyancy of the melt 32 from the gross weight of the silicon single crystal 2.

The silicon single crystal production apparatus 100 also includes a gas inlet 22 of the chamber 20 for introducing inert gas, a gas outlet 24 for discharging the inert gas from the chamber 20, and a rectifying cylinder 60 for rectifying the inert gas flow. The inert gas is typically Ar gas.

The melt 32 is a melt of raw material polycrystalline silicon. The crucible 30 is typically made of synthetic quartz glass. The base of the crucible 30 is connected with an axis 34 for supporting the crucible 30. The rectifying cylinder 60 is located above the crucible 30 and substantially forms a circular truncated cone.

A driving unit 10 includes a winder 12 for raising and lowering the wire 3 and a crucible driver 14 for rotating the crucible 30. The winder 12 is capable of rewinding and axially rotating the wire 3 at the same time. The axis 34 is connected to the crucible driver 14, and the crucible 30 can be rotated by the crucible driver 14 via the axis 34.

The magnetic field generating unit 50 includes a pair of coils 52. The pair of coils 52 is placed outside the chamber 20 to sandwich the chamber 20. The magnetic center L2 of the horizontal magnetic field generated by the coils 52 is substantially perpendicular to the central axis L1 of the silicon single crystal 2. The magnetic field generating unit 50 is capable of moving up and down along the central axis L1 of the silicon single crystal 2 so that the position of the magnetic center L2 will be shifted along the central axis L1 of the silicon single crystal 2.

The controller 1 is electronically connected to the winder 12, the heaters 42, 44, the crucible driver 14, and the magnetic field generating unit 50. The controller 1 is capable of controlling the rewinding speed of the wire 3, the rotation direction of the wire 3, and the rotation speed of the wire 3, i.e. the pulling speed of the silicon single crystal 2, the rotation direction of the silicon single crystal 2, and the rotation speed of the silicon single crystal 2, by means of the winder 12. The controller 1 is further capable of controlling the rotation direction and the rotation speed of the crucible 30 by means of the crucible driver 14.

The controller 1 is further capable of controlling the position of the coils 52 along the central axis L1 of the silicon single crystal 2, i.e. the position of the magnetic center L2 of the horizontal magnetic field, and controlling the magnetic flux density at the magnetic center L2 of the horizontal magnetic field so that it will be greater than or equal to 1000 Gauss, and less than or equal to 2000 Gauss.

The controller 1 is also capable of controlling the output power of the heaters 42, 44, and controlling the temperature of the melt 32 by adjusting the output power of the heaters 42 with the output power of the heaters 44 kept constant.

The controller 1 is electronically connected to the weight measuring unit 5, and is capable of monitoring the apparent weight of the silicon single crystal 2.

The controller 1 mainly comprises a CPU and a memory device, and is capable of storing the system operations of the whole silicon single crystal production equipment 100 into the memory device. The controller 1 is typically a PC or an EWS (Engineering Work Station). The silicon single crystal production method described below can be implemented by the controller 1 for controlling the operation of each unit.

The following is a production method of a silicon single crystal according to the present embodiment.

Figure 2:
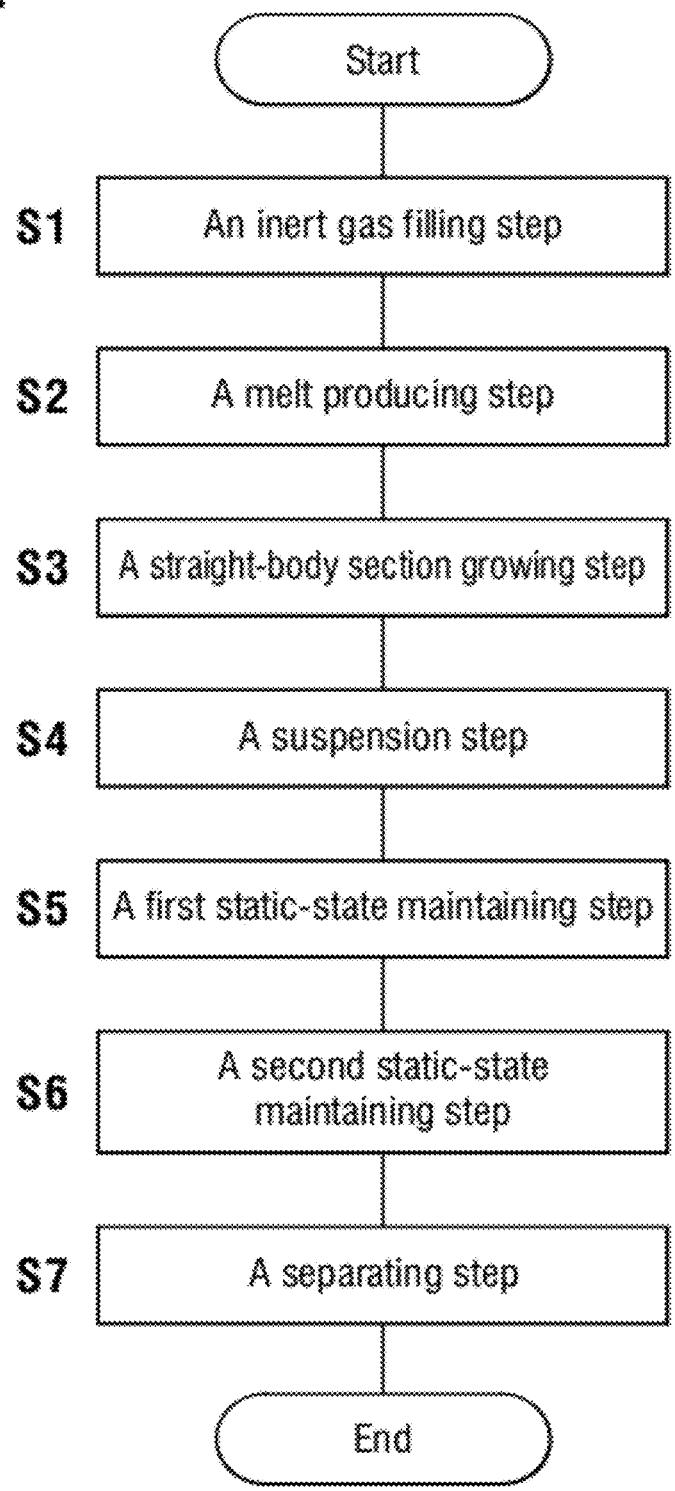
FIG. 2 is a flowchart showing a production method of a silicon single crystal according to the embodiment of FIG. 1.
Figure 3A:
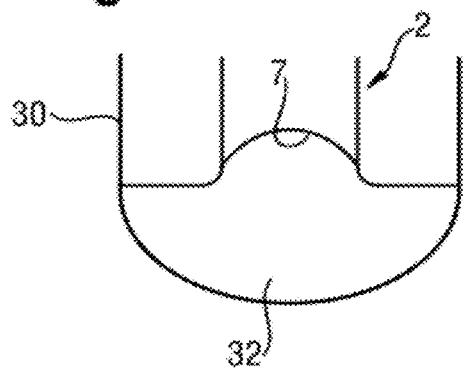
FIG. 3 is a partially-enlarged schematic view showing shape changes of the growth front of a silicon single crystal.
Figure 3D:
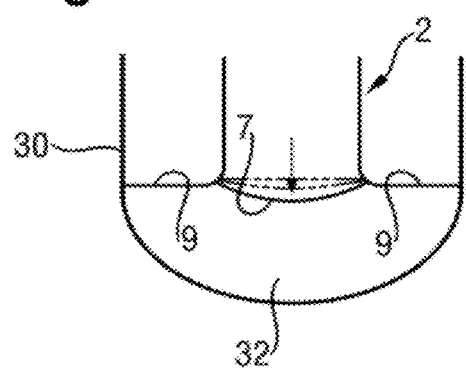
Figure 3B:
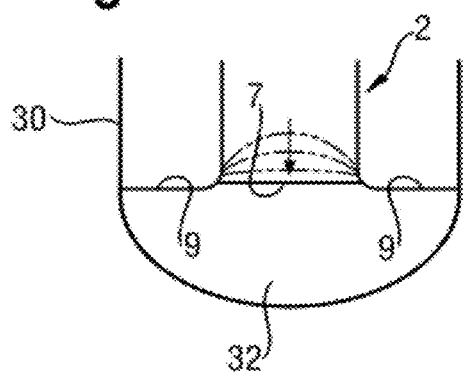
Figure 3E:
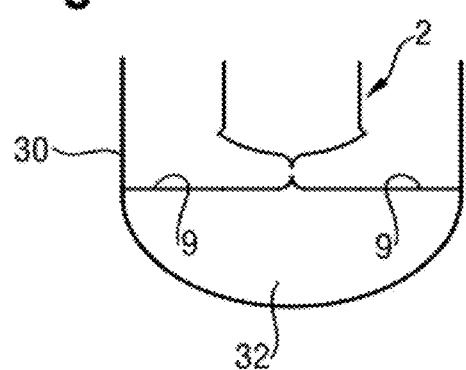
Figure 3C:
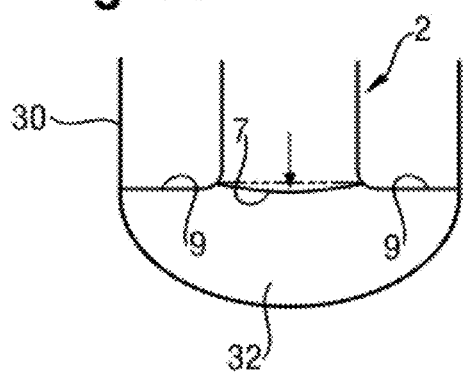

Referring to FIG. 2, the production method according to the present embodiment is to produce a silicon single crystal based on the CZ method, and includes an inert gas filling step S1 for creating an inert gas atmosphere inside the chamber 20; a melt producing step S2 for generating the melt 32; and a straight-body section growing step S3 (or step (1)) for growing the straight-body section 4 of the silicon single crystal 2. The production method also includes a suspension step S4 (or step (2)); a first static-state maintaining step S5 (or step (3)); a second static-state maintaining step S6 (or step (4)); and a separating step S7 (or step (5)) for separating the silicon single crystal 2 from the melt 32, all of which are intended to omit the tail-section of the silicon single crystal.

The inert gas filling step S1 includes steps of sealing the chamber 20, and introducing inert gas through the gas inlet 22 in parallel with evacuating the chamber 20 through the gas outlet 24 using a vacuum pump (not shown) in order to create an inert gas atmosphere inside the chamber 20. The inert gas atmosphere inside the chamber 20 is maintained by an inert gas flow into the chamber 20 in subsequent steps.

The melt producing step S2 which follows the inert gas filling step S1 includes a step of generating the melt 32 by melting the raw material injected into the crucible 30, using the heaters 42, 44.

The straight-body section growing step S3 which follows the melt producing step S2 includes steps of growing the straight-body section 4 of the silicon single crystal 2 by lowering the seed crystal 8 using the winder 12 to immerse it under the surface of the melt, and raising the silicon single crystal 2 from the melt 32 using the winder 12 under the influence of a horizontal magnetic field applied to the melt 32 having a magnetic flux density at its magnetic center L2 being greater than or equal to 1000 Gauss, and less than or equal to 2000 Gauss. The silicon single crystal 2 and the crucible 30 rotate axially in the opposite directions to each other.

The straight-body section 4 of the silicon single crystal 2 is a cylindrical portion with a nearly constant diameter in the direction parallel to the central axis L1 of the silicon single crystal 2. The straight-body section growing step S3 includes a step of growing the straight-body section 4 when the diameter of the silicon single crystal reaches a predetermined value after the formation of the cone section.

The suspension step S4 which follows the straight-body section growing step S3 includes a step of reducing the lifting speed of the silicon single crystal 2 to 0 mm/minute in the state where the upward and downward movement of the crucible 30 is suspended.

The first static-state maintaining step S5 which follows the suspension step S4 includes a step of maintaining the static state where the lifting speed of the silicon single crystal 2 is kept at 0 mm/minute until there is a decrease in the apparent weight of the silicon single crystal 2 measured by the weight measuring unit 5.

The second static-state maintaining step S6 which follows the first static-state maintaining step S5 includes a step of continuing to maintain the static state so that the whole growth front of the silicon single crystal 2 in contact with the surface of the melt 32 forms a convex shape which protrudes in the opposite direction to the pulling direction of the silicon single crystal 2 (hereinafter referred to as "downward convex shape" for simplification).

The suspension step S4, the first static-state maintaining step S5, and the second static-state maintaining step S6 are executed under the influence of a horizontal magnetic field applied to the melt 32 having a magnetic flux density greater than or equal to 1000 Gauss, and less than or equal to 2000 Gauss, analogously to the straight-body section growing step S3.

Apart from the present embodiment, the suspension step S4, the first static-state maintaining step S5, and the second static-state maintaining step S6 can also include a step of cutting off the horizontal magnetic field, but this may be cause to a current change in the melt 32, and it may cause dislocations. Accordingly, in the present embodiment, the suspension step S4, the first static-state maintaining step S5, and the second static-state maintaining step S6 should preferably involve continued application of the horizontal magnetic field in order to prevent dislocations.

The suspension step S4, the first static-state maintaining step S5, and the second static-state maintaining step S6 also involve axial rotations of the silicon single crystal 2 and the crucible 30 in the opposite directions to each other.

The separating step S7, which follows the second static-state maintaining step S6, includes separating the silicon single crystal 2 from the melt 32 by ceasing rewinding of the wire 3, and lowering the crucible 30.

Referring to FIG. 3, the shape changes of the growth front 7 of the silicon single crystal 2 from the straight-body section growing step S3 to the separating step S7 are described below.

As shown in FIG. 3 (A), the growth front 7 of the silicon single crystal 2 forms a convex shape which protrudes in the same direction as the pulling direction of the silicon single crystal (hereinafter referred to as "upward convex shape" for simplification) in the straight-body section growing step S3.

As shown in FIG. 3 (B), the growth front 7 starts to grow in the opposite direction to the lifting direction of the silicon single crystal when the lifting speed of the silicon single crystal 2 reaches 0 mm/minute in the suspension step S4.

As shown in FIG. 3 (B) and FIG. 3 (C), the upward convex shape of the growth front 7 is gradually reduced to become substantially flat, i.e. the growth front 7 is substantially aligned with the fluid surface 9 of the melt 32 in the first static-state maintaining step S5. The growth front 7 then transforms into a downward convex shape, and ends up being located under the fluid surface 9.

The silicon single crystal 2 is free from the buoyancy of the melt 32 and its apparent weight gradually increases with the reduction of the upward convex shape of the growth front 7 due to the growth of the silicon single crystal 2 as long as the growth front 7 is located above the fluid surface 9. However, when the growth front 7 transforms into a downward convex shape to be located under the fluid surface 9, the silicon single crystal 2 is affected the buoyancy of the melt 2 and its apparent weight starts to decrease.

As shown in FIG. 3 (D), the whole growth front 7 transforms into a downward convex shape due to the maintained static state in the second static-state maintaining step S6.

Under the influence of the horizontal magnetic field, the entire growth front is more difficult to transform into the downward convex shape and therefore the silicon single crystal 2 is more easily separated from the melt 32 before the transformation of the entire growing front into the downward convex shape, as compared to the absence of the horizontal magnetic field. It is therefore important to bring the entire growth front 7 into the downward convex shape in the first static-state maintaining step S5 and the second static-state maintaining step S6.

The following is a description of Example 1 and 2 as well as Comparative Examples 1-4 of the actual production of silicon single crystals according to the above-described silicon single crystal production method.

In Examples 1, 2 and Comparative Examples 1-4, 240 kg of the raw material was introduced into the crucible 30 made of synthetic quartz glass, and the inner pressure of the chamber 20 was reduced to 70 mbar. The silicon single crystal 2 was produced under the influence of a horizontal magnetic field applied to the melt 32 having different magnetic densities. The diameter of the silicon single crystals 2 produced was 450 mm.

The magnetic flux density was set at 3000 Gauss in Comparative Examples 1 and 2, 3800 Gauss in Comparative Example 3, and 500 Gauss in Comparative Example 4. The magnetic flux density was set at 1000 Gauss in Example 1, and 2000 Gauss in Example 2. Table 1 shows the results from Examples 1, 2 and Comparative Examples 1-4.

| | weight of raw material (kg) | crucible | inner pressure (mbar) | magnetic flux density (gauss) | results |
|---|---|---|---|---|---|
| Comp. Example 1 | 240 | synth. quartz glass | 70 | 3000 | deformation or dislocations in the straight-body section occurred. |

-continued

| | weight of raw material (kg) | crucible | inner pressure (mbar) | magnetic flux density (gauss) | results |
|---|---|---|---|---|---|
| Comp. Example 2 | 240 | synth. quartz glass | 70 | 3000 | the omission of the tail section was not successful. |
| Comp. Example 3 | 240 | synth. quartz glass | 70 | 3800 | deformation or dislocations in the straight-body section occurred. |
| Comp. Example 4 | 240 | synth. quartz glass | 70 | 500 | deformation or dislocations in the straight-body section occurred. |
| Example 1 | 240 | synth. quartz glass | 70 | 1000 | deformation and dislocations in the straight-body section were suppressed, and the omission of the tail section was successful. |
| Example 2 | 240 | synthetic quartz glass | 70 | 2000 | deformation and dislocations in the straight-body section were suppressed, and the omission of the tail section was successful. |

As shown in Table 1, the generation of the straight-body section was successful in Examples 1 and 2 with the magnetic flux density being greater than or equal to 1000 Gauss, and less than or equal to 2000 Gauss. On the other hand, deformation and the dislocations in the straight-body section occurred in Comparative Example 1, 3 and 4 with the magnetic flux density being less than 1000 Gauss, and more than 2000 Gauss.

Accordingly, it is understood that the magnetic flux density should be preferably greater than or equal to 1000 Gauss, and less than or equal to 2000 Gauss, and this flux density range can achieve the suppression of deformation and dislocations in the straight-body section. On the other hand, it appears that a magnetic flux density less than 1000 Gauss tends to cause deformation of the silicon single crystals 2; and a magnetic flux density more than 2000 Gauss tends to prevent the growth front 7 from transforming into the downward convex shape.

In Comparative Example 2, the omission of the tail section was not successful while the deformation and dislocations in the straight-body section were suppressed. On the other hand, the omission of the tail section and the suppression of the dislocations in the straight-body section were both successful in Examples 1 and 2.

Figure 4:
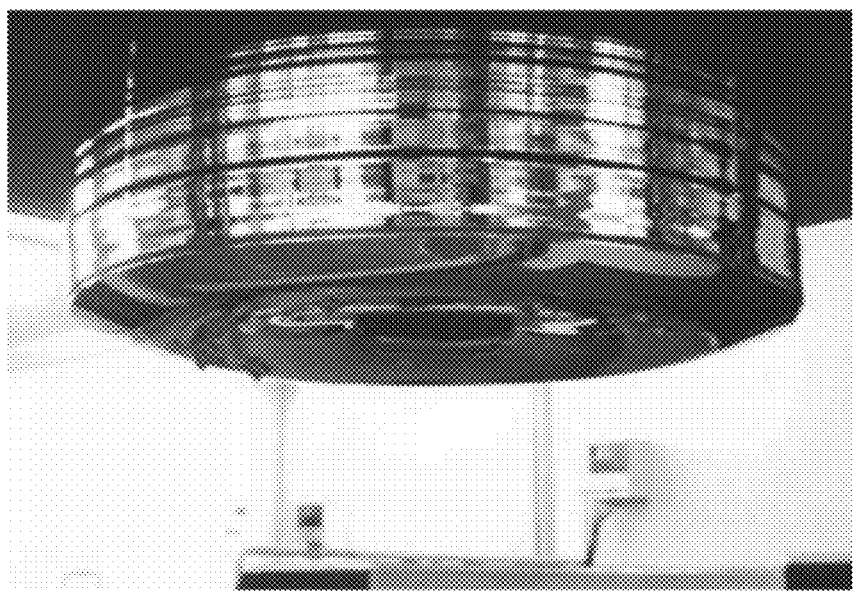
FIG. 4 is a picture showing an example of the growth front of a silicon single crystal whose tail-section has failed to be omitted.

In the examples which resulted in the failed omission of the tail section, the growth front 7 admittedly transformed into the downward convex shape to some extent as shown in FIG. 4, but the separation of the silicon single crystal 2 from the melt 32 still had to take place before the adequate transformation of the whole growth front 7 as the downward convex shape in this example was formed by the partial growth front 7 but not the entire growth front 7.

Figure 5:
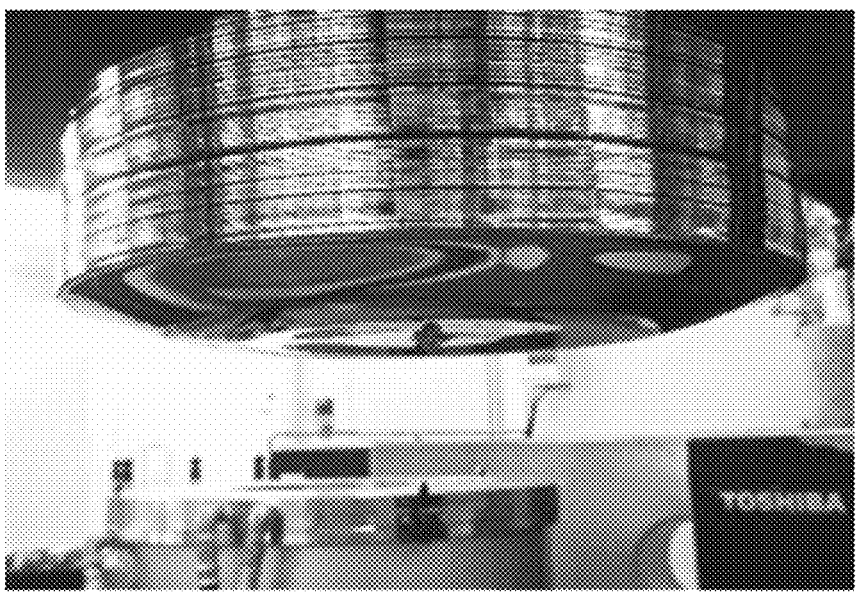
FIG. 5 is a picture showing an example of the growth front of a silicon single crystal whose tail-section has been successfully omitted.

On the other hand, in the examples which resulted in the successful omission of the tail section, the whole growth front 7 transformed into the downward convex shape as shown in FIG. 5, and therefore occurrence of dislocations in the straight-body section was properly suppressed during the separation of the silicon single crystal 2 from the melt 32, even under the influence of the horizontal magnetic field.

The following is a description of the effects exerted by the present embodiment.

The present embodiment can achieve the controlled natural current in the melt 32 by lifting up the silicon single crystal 2 under the influence of the horizontal magnetic field with a magnetic flux density being greater than or equal to 1000 Gauss, and less than or equal to 2000 Gauss, thereby allowing for suppression of deformation and dislocations in the straight-body section 4.

The present embodiment can also prevent the silicon single crystal 2 from being separated from the melt 32 before the adequate transformation of the growth front 7 into the downward convex shape, by suspending the lifting movement of the silicon single crystal 2 relative to the liquid surface of the melt 32 until there is a decrease in the apparent weight of the silicon single crystal 2, and maintaining the static state afterwards so that the whole growth front 7 of the silicon single crystal 2 will form the downward convex shape, thereby allowing for the suppression of the dislocations even under the influence of the horizontal magnetic field and consequently the successful omission of the tail section.

The present invention is not limited to the embodiments described above, and therefore it can be modified within the scope of the appended claim. For example, the driving unit 10 can not only move the silicon single crystal 2 up and down, but also the crucible 30. The crucible driver 14 can also rotate or raise or lower the crucible 30. The driving unit can also lift up the crucible 30 at the same lifting speed as that of the silicon single crystal 2 so that the relative speed of silicon single crystal 2 to the fluid surface of the melt 32 will be reduced to zero, and then suspend the relative movement of the silicon single crystal 2 to the melt 32 for a certain period of time.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing a silicon single crystal by the Czochralski method, comprising the steps of:
   (1) growing a straight body section of the silicon single crystal by pulling up the silicon single crystal under the influence of a horizontal magnetic field applied to a raw material melt contained in a crucible, the horizontal magnetic field having a magnetic flux density at its magnetic center of greater than or equal to 1000 Gauss, and less than or equal to 2000 Gauss;
   (2) reducing the pulling speed of the silicon single crystal relative to the surface of said melt to 0 mm/minute after step (1);
   (3) measuring the apparent weight of the silicon single crystal and maintaining a static state where the relative lifting speed of the silicon single crystal is kept at 0 mm/minute until there is a decrease in the apparent weight of the silicon single crystal, after the step (2);

(4) further maintaining the static state so that the entire growth front of the silicon single crystal in contact with the melt forms a convex shape protruding in a direction opposite to the pulling direction of the silicon single crystal, after step (3); and
(5) separating the silicon single crystal from said melt, after step (4).

* * * * *